(12) United States Patent
McLaury

(10) Patent No.: US 6,288,937 B1
(45) Date of Patent: Sep. 11, 2001

(54) DECODED GENERIC ROUTING POOL

(75) Inventor: Loren McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/567,898

(22) Filed: May 10, 2000

(51) Int. Cl.[7] .................................................. G11C 16/04
(52) U.S. Cl. ................. 365/185.05; 365/63; 365/230.06; 365/230.09; 365/239
(58) Field of Search ............................... 365/185.05, 63, 365/230.06, 230.09, 239

(56) References Cited

U.S. PATENT DOCUMENTS

| | | | |
|---|---|---|---|
| 4,725,742 | * 2/1988 | Tachimori et al. | 307/449 |
| 5,204,556 | 4/1993 | Shankar | 307/465.1 |
| 5,251,169 | 10/1993 | Josephson | 365/72 |
| 5,394,033 | 2/1995 | Tsui et al. | 326/41 |
| 5,452,229 | 9/1995 | Shankar et al. | 364/489 |
| 5,923,585 | * 7/2000 | Wong et al. | 365/185.03 |
| 6,150,838 | * 11/2000 | Wittig et al. | 326/39 |

* cited by examiner

*Primary Examiner*—David Nelms
*Assistant Examiner*—Connie C. Yoha
(74) *Attorney, Agent, or Firm*—Skjerven Morrill MacPherson LLP; Tom Chen

(57) ABSTRACT

A method and system are provided which allows N programmable cells to be used to select one of $2^N$ signals for routing to a desired destination, such as a programmable array logic (PAL), for further processing. N input selection signals are used to generate N selection signals and their corresponding complements using N programmable cells. These selection signals are then used to generate coded selection signals, which can be separated into groups of one or more. Each group of coded selection signals is then decoded, such as with K×1 tree decoders, where K is not greater than $2^N$. Tree decoders are typically cascaded such that the first stage or group of decoders select a portion of the $2^N$ signals and then subsequent decoder(s) select portion(s) of the previous selected signals until the one desired signal is selected from the $2^N$ signals. A different set of N input selection signals can be used to select a signal from the same $2^N$ signals in order to select more than one of the $2^N$ signals.

24 Claims, 10 Drawing Sheets

DECODED GENERIC ROUTING POOL

BACKGROUND

1. Field of the Invention

This invention relates to programmable logic devices, and in particular, to the interconnects or routing pools for such devices.

2. Description of Related Art

Integrated circuits (ICs) can be designed to implement and carry out desired functions for various applications and needs. One such IC is the application specific integrated circuit or ASIC, which are designed to carry out specific applications. However, ASICs can only be used for the applications they were desired for. As circuitry and functions become more and more complex, requiring very specific functions for the IC to perform, designing, testing, and manufacturing ASICs for very narrow uses can increase the cost per ASIC and make the ASIC cost prohibitive.

Programmable logic devices (PLDs) can implement a variety of functions using a single semiconductor chip. FIG. 1 shows a generalized PLD 100 which includes an interconnect or generic routing pool (GRP) 110, a programmable array logic (PAL) 120, and a generic logic blocks (GLBs) 130. GRP 110 is a global interconnect circuit or matrix for selecting desired signals to be applied to PAL 120, i.e., for connecting desired terms to PAL 120. The signals can be selected from external input/output (I/O) pins, output terminals of GLBs 130, or other suitable signal sources. The total number of signals or terms input to GRP 110 can be hundreds or even thousands. The desired signals are then selected by GRP 110 and routed to input terminals of PAL 120, which is a programmable array of AND gates. After performing desired AND functions on the selected terms, the resulting product terms are input to GLBs 130. GLBs 130, also known as macrocells, contain a programmable array of OR gates for performing OR functions on the input product terms, i.e., selective summing of the product terms. In addition to OR gates, a GLB can also include other logic gates, such as exclusive OR (XOR) gates, registers, I/O cells, etc. The output signals from GLBs 130 can then be used for the desired application or can be fed back into GRP 110 for further processing.

The programmable arrays or matrices within GRP 110, PAL 120, and/or GLBs 130 are programmed according to the specification provided by the circuit designer for implementing the desired function. Programming typically involves either selectively breaking or maintaining electrical connections between GRP input signals, the AND gates, and the OR gates. FIG. 2 shows an interconnection matrix 200, which is a portion of GRP 110 for selectively making the desired connections from the input terminals to the output terminals of GRP 110. Matrix 110 has four input terminals 201–204 coupled to four corresponding columns of signal lines and three output terminals 211–213 coupled to three corresponding rows of signal lines. Note that the use of "rows" and "columns" is arbitrary, simply designating directions of the signal lines. Also, it should be noted that any number of input terminals and output terminals are possible, with the number of output terminals typically more than or equal to the number of input terminals.

The rows and columns are approximately orthogonal to each other, with a pass transistor coupled at the intersection of each row and column signal line. Each pass transistor 221–232 acts as a switch to either connect or disconnect the signal at an input terminal to the corresponding output terminal. Pass transistors 221–232 are shown as N-type transistors, although other types are also suitable. The drain of each pass transistor is coupled to a corresponding column signal line and the source of each pass transistor is coupled to a corresponding row signal line. The control gate of each pass transistor 221–232 is coupled to the output terminal of an associated programmable cell 221A–232A. Programmable cells 221A–232A, which typically include non-volatile memory cell(s), apply different voltage levels to the control gates of the pass transistors, based on user-supplied input signals to the programmable cells. In general, the programmable cells can be any circuit or device capable of holding and outputting a state and its complement in response to external inputs.

Connections from signals on the input terminals to an output terminal are made by turning on the desired pass transistor, where a "high" voltage to the control gate turns on a pass transistor and a "low" voltage to the control gate turns off a pass transistor. For example, if pass transistors 223, 225, and 232 are on (programmable cells 223A, 225A, and 232A apply "high" voltages), current flows through pass transistors 223, 225, and 232, thereby pulling voltages at output terminals 211–213 up to the voltages at input terminals 203, 201, and 204, respectively. The voltages at the input terminals can be from I/O pins, feedback from the GLBS, etc. The signals at output terminals 211–213 are then input to PAL 120 for ANDing.

As seen from FIG. 2, a GRP requires twelve programmable cells and pass transistors or switches in order to provide complete connectivity between the four input terminals and the three output terminals. However, as semiconductor technology continues to advance and functions become more complex, PLDs are needed to perform functions requiring larger numbers of inputs and input combinations, which necessitates larger sized routing devices. A typical PLD currently in use selects 16 out of 256 signals for transmission to a PAL for the ANDing function (e.g., a 2128 device from a 2K family of devices, such as from Lattice Semiconductor, Corp. of Hillsboro, Oreg.). Thus, in order to provide complete connectivity, 4,096 (16*256) programmable cells are required in the GRP.

However, implementation of a PLD having a GRP with over four thousand programmable cells and switches or interconnects is impractical. Thus, a GRP can be designed where the 256 input signals are partitioned into 16 groups of 16 signals. One signal is selected from each of the 16 groups and input into an AND array. Thus, 16 out of the 256 input signals are selected for ANDing. This reduces the number of programmable cells and interconnects from 4096 to 256 (16*16) for a 16-fold reduction. However, this reduction comes with the price of decreased connectivity because the 256 input signals can no longer be connected in any combination to 16 outputs.

FIG. 3 shows a 1×16 interconnection matrix 300 for selecting one of 16 signals. Sixteen matrices 300 allow 16 signals to be selected from 256 signals. Matrix 300 includes 16 pass transistors 301–316 coupled to 16 programmable cells 301A–316A, respectively, with each pass transistor coupled to a column signal line and all 16 pass transistors coupled to one row signal line, similar in operation to that of matrix 200 of FIG. 2. Matrix 300 has the 16 column signal lines coupled to 16 input terminals and the row signal line coupled to one output terminal. The output terminal is coupled to one input of a 16-input AND array 360. Thus, using this configuration, 16 of matrices 300, utilizing a total of 256 programmable cells, can be used to select 16 of 256 signals for transmission to the AND array. However, this configuration does not allow two or more signals from a group of 16 signals to be selected for inputting to the AND array. For example, if programmable cell 302A turns on pass transistor 302, thereby placing the signal at the associated input terminal 322 on the row signal line, the other 15 signals of the group at input terminals 321 and 323–336 cannot be selected.

FIG. 4 is another interconnection matrix 400 that allows greater selectivity of input signals by using two 1×32 matrices 400A and 400B coupled to the same group of 32 input signals. Matrices 400A and 400B each are a 1×32 matrix for selecting one of 32 input signals. Matrix 400A, which is the same as matrix 400B, includes 32 pass transistors 401–432 coupled to 32 programmable cells 401A–432A, respectively, with each pass transistor coupled to a column signal line and all 32 pass transistors coupled to one row signal line 497. Matrix 400 has the 32 column signal lines coupled to 32 input terminals 465–496 and the row signal line coupled to one output terminal. The output terminal is coupled to one input of a 16-input AND array 499. Eight pairs of matrices 400A and 400B allow 16 signals to be selected from 256 signals for input to AND array 499. Thus, instead of the interconnection matrix selecting one of 16 input signals from each of the 16 input signal groups, as with the matrix of FIG. 3, the matrix of FIG. 4 selects two of 32 input signals from each of 8 input signal groups, both resulting in the selection of 16 of 256 input signals.

However, with the matrix of FIG. 4, signal selectivity is increased. For example, if programmable cell 402A turns on pass transistor 402, thereby placing the signal at the associated input terminal (i.e., input terminal 466) on row signal line 497 for input to AND array 499, the other signals on the first group of 16 input terminals (i.e., input terminals 465 and 467–480) are not precluded from being selected as another input to the AND array. Thus, another one of the signals on input terminals 465 and 467–480 (and also on input terminals 481–496 representing the second group of 16 signals) can be selected as an input to AND array 499 by programming an associated programmable cell 433A and 435A–464A to turn on a corresponding one of pass transistors 433 and 435–464 for transmission via row signal line 498. Note that the signal on input terminal 466 can also be selected again for transmission via row signal line 498 by turning on programmable cell 434A.

Thus, by increasing the number of pass transistors and programmable cells from 16 to 32 for each of the 16 row signal lines, the selectivity of the GRP is increased. However, the increased selectivity requires doubling the number of programmable cells and pass transistors. Because, a GRP typically takes up 50% or more of the die area of a PLD, by increasing selectivity, the size of the GRP, and accordingly of the PLD, is greatly increased. In addition to an increase in size, the signal delay in transmission through the GRP increases with a larger number of transmission paths.

Accordingly, a routing or interconnect device is desired that overcomes the deficiencies described above of conventional routing devices.

SUMMARY

In accordance with the invention, a method and system are provided that allows N, instead of $2^N$, programmable cells to select one of $2^N$ input signals for routing to a desired destination, such as a programmable array logic (PAL). Based on N input selection signals, the N programmable cells generate signals that are decoded to select one of the $2^N$ input signals for transmission to and processing in the next stage.

In one embodiment, N input selection signals are input to a term generation circuit, which generates N selection signals and their corresponding complements. The term generation circuit includes N programmable cells, each programmable cell outputting one selection signal and its complement based on the N input selection signals. The N selection signals and their complements are then input to a pre-coding circuit, which, in one embodiment, is a set of NOR gates. From the selection signals, the pre-coding circuit outputs either a single group or multiple groups of coded signals, where the number of groups k and number of coded signals $X_i$ per group is given by the following:

$$2^N = \prod_{i=1}^{k} X_i.$$

The coded signals from the pre-coding circuit are transmitted to a decoder circuit. The decoder circuit is separated into k sequentially coupled sub-groups of decoder circuits. The first of the sub-group of decoder circuits is divided into multiple $X_1 \times 1$ decoders, the second sub-group is divided into $X_2 \times 1$ decoder(s), and so until the last sub-group having one $X_k \times 1$ decoder. The first of the sub-group of decoders receives the $2^N$ input signals, which are divided into signal groups containing $X_1$ input signals each. Thus, each of the groups of $X_1$ input signals is transmitted to one $X_1 \times 1$ decoder. Based on the first group of $X_1$ coded signals, each $X_1 \times 1$ decoder selects one signal from each group of $X_1$ input signals. If the number of $X_1 \times 1$ decoders is equal to $X_2$, then the selected signals from the first sub-group of decoders is input to one $X_2 \times 1$ decoder, which selects the desired signal from the previously $X_2$ input signals, based on the second group of $X_2$ coded signals. However, if the number of $X_1 \times 1$ decoders is not equal to $X_2$, then the selected signals from the $X_1 \times 1$ decoders are grouped and input to multiple $X_2 \times 1$ decoders for further selection of the input signals. This selection process continues until one signal is selected from the original $2^N$ input signals. Thus, only N programmable cells are used to select $2^N$ input signals.

The same $2^N$ input signals can be input to another term generation circuit, pre-coding circuit, and decoding circuit while using a different N-input selection signal to select two of the $2^N$ input signals. This can be extended to select more than two signals from the $2^N$ input signals. Further, by separating a larger group of input signals into M smaller groups of $2^N$ input signals, M or more of $M*2^N$ input signals can be selected for processing, while only utilizing $M*N$ programmable cells.

As an example of the present invention described above, if N=5 ($2^N$=32), then the groupings can be two groups (k=2) of the following: (2,16), (4,8), (8,4), or (16,2) or three groups (k=3) of the following: (2,4,4), (2,2,8), (2,8,2), (4,2,4), (4,4,2), or (8,2,2). Similarly, more groups are also possible. If the two groups of 8 ($X_1$=8) and 4 ($X_2$=4) coded signals are desired, the 32 input signals are divided into four groups of 8 ($X_1$=8) and input to the first sub-group decoder circuit comprising of four 8×1 decoders. Five input selection signals are used by the term generation circuit, comprising of five programmable cells, to output five selections signals and their complements to the pre-coding circuit. Three selection signals (and their complements) are input to a first group of eight 3-input NOR gates and the remaining two selection signals (and their complements) are input to a second group of four 2-input NOR gates. The eight ($X_1$=8) coded signal outputs from the eight 3-input NOR gates are input to each of the four 8×1 decoders, which then selects one of eight input signals from each of the four groups. The four ($X_2$=4) signals are then transmitted to the 4×1 decoder, which selects one of the four signals based on the four ($X_2$=4) coded signal outputs from the four 2-input NOR gates. The result is a selection of one of 32 input signals using only five programmable cells.

The present invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with the present invention, an interconnect circuit utilizes N, instead of $2^N$, programmable cells to select one of $2^N$ input signals for further processing, such as to a programmable array logic (PAL). The N programmable cells generate signals that are decoded to select one of the $2^N$ input signals for transmission to the next stage.

Figure 5:
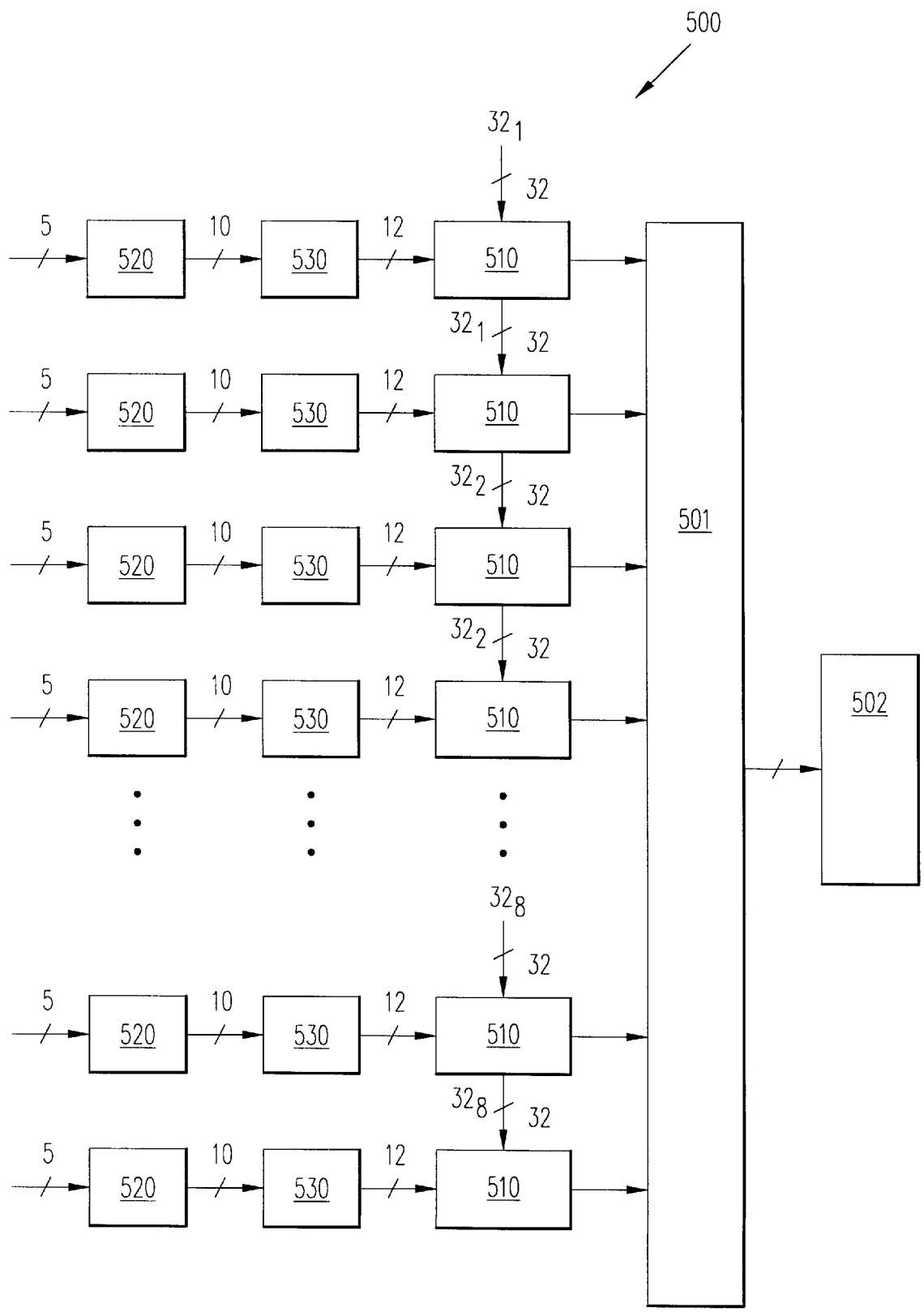
FIG. 5 is a block diagram of a portion of a PLD for selecting 16 of 32 input signals, according to one embodiment of the present invention.

FIG. 5 shows a portion of a programmable logic device (PLD) 500 for selecting 16 of 256 input signals for processing, such as with a PAL 501 followed by generic logic blocks (GLBs) 502, according to one embodiment of the present invention. Note that the following discussion is for illustration purposes and it not meant to be limiting. For example, other numbers and groupings of signals can be utilized for the input and the output to PAL 501. 256 input signals are grouped into eight groups of 32, with the eight groups designated as $32_1$ to $32_8$. Each of the eight groups of 32 signals is input to a pair of decoders 510, with each pair of decoders selecting two signals from the corresponding group of 32. Thus, a total of eight pairs of 32 to 1 decoders 510 select a total of 16 signals from the 256 input signals for input to PAL 501.

Determining which one of the 32 signals in each group is selected is controlled by a 5-bit input selection signal (i.e., $2^5$=32). Each 5-bit input selection signal is coupled to a term generation circuit 520, which outputs a 10-bit signal comprising a 5-bit signal, indicating which of the 32 signals is selected, and a corresponding 5-bit complement. Each of the resulting 10-bit signals is then transmitted to a pre-decoding circuit 530, which outputs a 12-bit signal to one 32 to 1 decoder 510 for selection of one of 32 input signals. Sixteen of term generation circuits 520, pre-decoding circuits 530, and decoders 510 form a generic routing pool (GRP), which selects two signals from each of the eight groups of 32 signals for an effective selection of 16 of 256 signals. Thus, the GRP takes 16 groups of 5-bit input selection signals to select one of 32 signals from each of the 16 groups and outputs the desired or selected signals to PAL 501.

Figure 6:
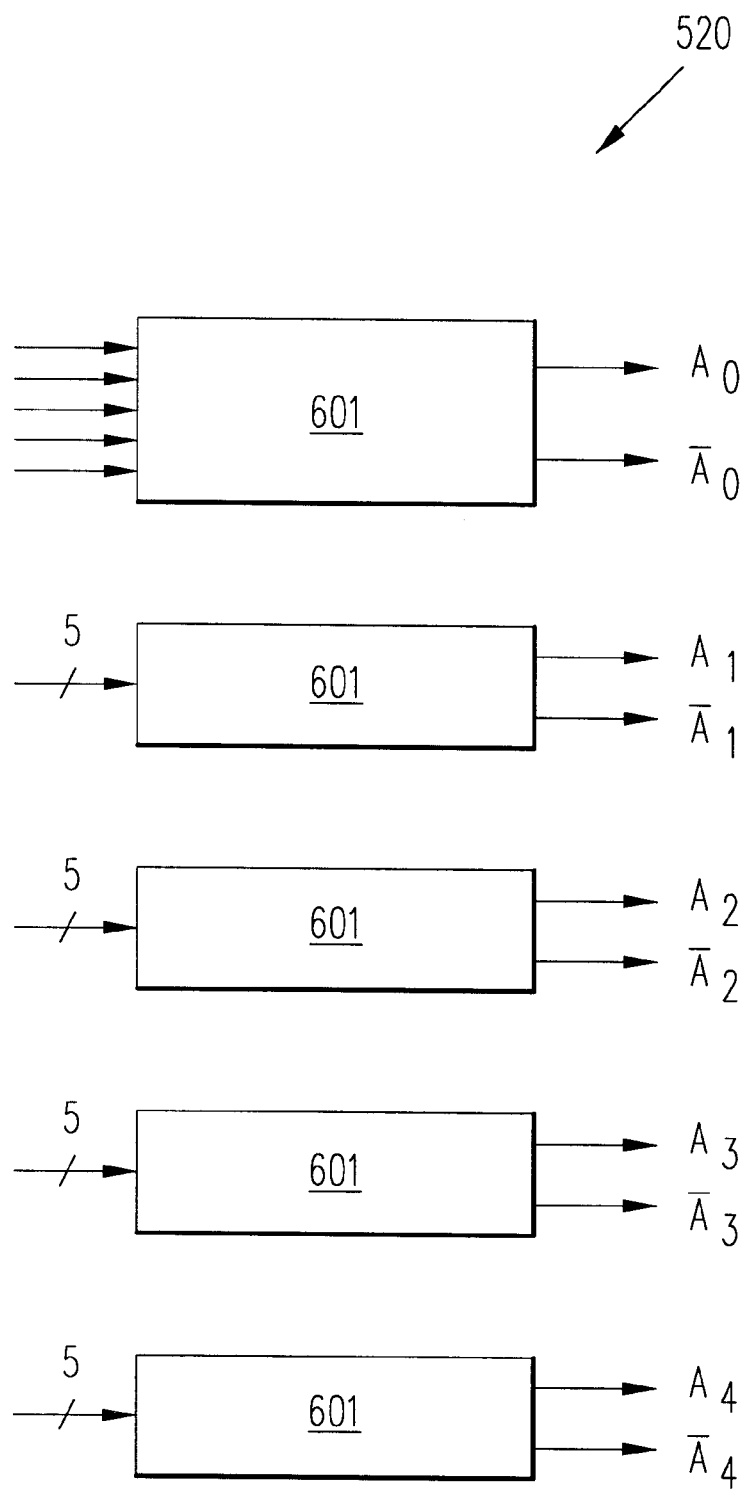
FIG. 6 is a diagram of a term generation circuit of the PLD of FIG. 5 according to one embodiment.

FIGS. 6, 7A–7C, and 8A–8B show, in more detail, term generation circuit 520, pre-decoding circuit 530, and decoder 510, respectively, for selecting one of 32 signals. Note that circuitry and methods can be used, other than described herein, to allow a five-bit selection signal to select one of 32 input signals, as is known by those skilled in the art. In FIG. 6, term generation circuit 520 includes five programmable cells 601. Each programmable cell 601 has five input terminals and two complementary output terminals. Other types of programmable cells can also be used, such as disclosed in commonly-owned U.S. Pat. No. 5,251,169, entitled "Non-Volatile Erasable and Programmable Interconnect Cell" to Josephson, which is incorporated by reference in its entirety. In general, any suitable circuit or device capable of holding and outputting a signal and its complement in response to external inputs are suitable with this invention. Such devices are well known to those skilled in the art. Four of the five input selection signals are common to each of the five programmable cells 601, with the fifth input selection signal dictating the value of the programmable cell output. Thus, in effect, the five fifth input selection signals represent which one of 32 input signals is selected. The value of signals $A_0$ to $A_4$ indicates which of the 32 input signals are to be selected. For example, to select the third signal from a group of 32, $A_4A_3A_2A_1A_0$ would be equal to 00011 (and $\overline{A_4}\,\overline{A_3}\,\overline{A_2}\,\overline{A_1}\,\overline{A_0}$ would be equal to 11100). The ten desired output signals from term generation circuit 520 are then transmitted to pre-decoding circuit 530.

Figure 7A:
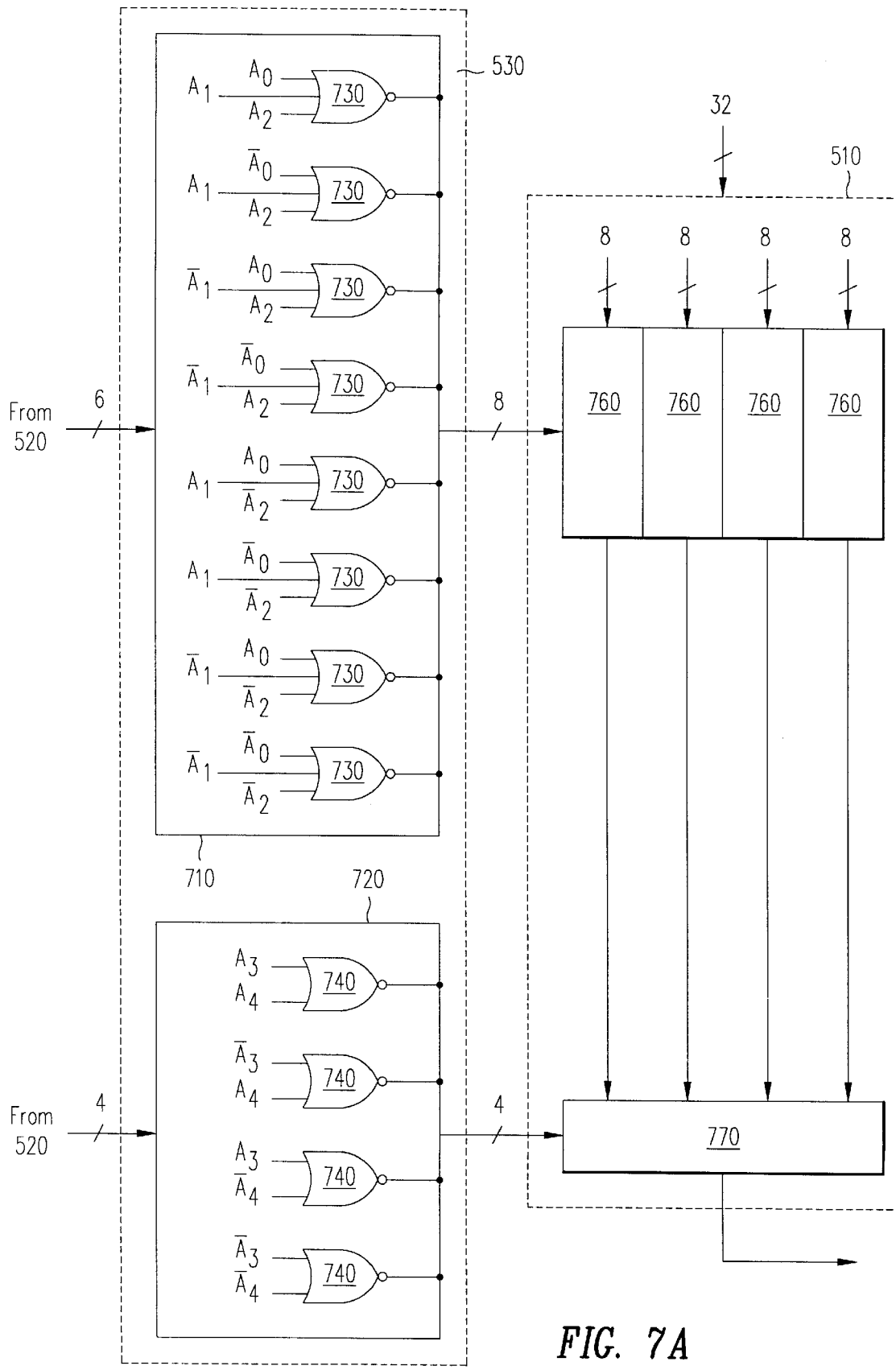
FIG. 7A is a diagram of a pre-decoding circuit and a decoder circuit of the PLD of FIG. 5 according to one embodiment.

FIG. 7A shows one embodiment of pre-decoding circuit 530 and decoder circuit 510. Pre-decoding circuit 530 includes a three-input NOR decoder 710, which accepts signals $A_2A_1A_0$ and their complements from term generation circuit 520, and a two-input NOR decoder 720, which accepts signals $A_4A_3$ and their complements from term generation circuit 520. NOR decoder 710 has a series of eight three-input NOR gates 730 for the eight possible combinations of $A_2A_1A_0$ and NOR decoder 720 has a series of four two-input NOR gates 740 for the four possible combinations of $A_4A_3$. Thus, NOR decoder 710 outputs eight signals, and NOR decoder 720 outputs four signals. Because of the NOR function, only one output is at a high voltage at any one time for the eight signal combinations to NOR decoder 710, and only one output is at a high voltage at any one time for the four signal combinations to NOR decoder 720. With this partitioning, the input group of 32 signals to decoder circuit 510 for selection is divided into four groups of eight signals each. The eight output signals from NOR decoder 710 are transmitted to decoder circuit 510 for selection of one of eight signals from each of the four groups of signals coupled to a corresponding one of four 8 to 1 decoders 760. The four output signals from decoder 720, which are also transmitted to decoder circuit 510, then select, via a 4 to 1 decoder 770, one of the four signals from the four 8 to 1 decoders 760. The result is that only one of the 32 input signals is selected. There are many suitable ways to implement both NOR decoders, as are known to those skilled in the art, for use with the present invention.

Figure 7B:
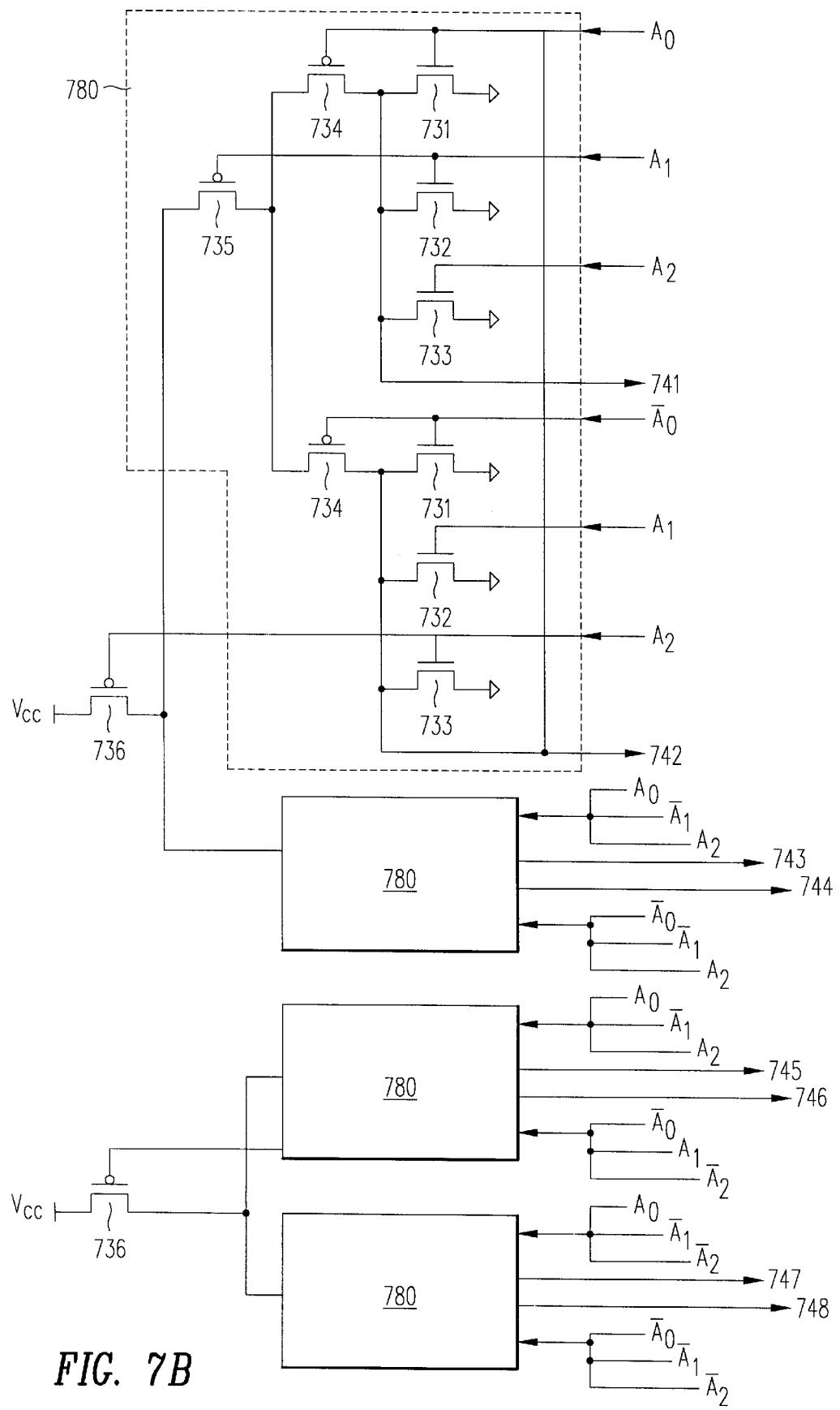
FIG. 7B is a diagram of one embodiment of a three-input NOR decoder for outputting eight signals for use as a portion of the pre-decoding circuit of FIG. 7A.

FIG. 7B shows one implementation of three-input NOR decoder 710, which includes a series of P-channel and N-channel transistors. Each of the eight NOR gates 730 has three N-channel transistors 731–733 and one P-channel transistor 734. Each pair 780 of NOR gates also shares one P-channel transistor 735, and each group of four NOR gates 730 shares one P-channel transistor 736 coupled to a supply voltage Vcc. One of output terminals 741–748 from each NOR gate 730 is coupled to one of eight input terminals of decoder circuit 510. Based on the input to NOR decoder 710, the signals $A_2 A_1 A_0$ dictate which one of eight output terminals 741–748 is at a "high" voltage. The other seven output terminals are at a "low" voltage. Table 1 below lists the values of $A_2 A_1 A_0$ for selecting the listed ones of the 32 input signals and the corresponding one of the eight output terminals that are at a high voltage.

TABLE 1

| $A_2 A_1 A_0$ | Input signal selected | Output terminal high |
| --- | --- | --- |
| 000 | $S_0, S_8, S_{16}, S_{24}$ | 741 |
| 001 | $S_1, S_9, S_{17}, S_{25}$ | 742 |
| 010 | $S_2, S_{10}, S_{18}, S_{26}$ | 743 |
| 011 | $S_3, S_{11}, S_{19}, S_{27}$ | 744 |
| 100 | $S_4, S_{12}, S_{20}, S_{28}$ | 745 |
| 101 | $S_5, S_{13}, S_{21}, S_{29}$ | 746 |
| 110 | $S_6, S_{14}, S_{22}, S_{30}$ | 747 |
| 111 | $S_7, S_{15}, S_{23}, S_{31}$ | 748 |

For example, if $A_4 A_3 A_2 A_1 A_0 = 10101$, then signal $S_{21}$ is to be selected from the group of 32 input signals $S_0$ to $S_{31}$. With $A_2 A_1 A_0 = 101$ and correspondingly, $\overline{A_2}=0$, $\overline{A_1}=1$, and $\overline{A_0}=0$, output terminals 741–745 and 747–748 are at a low voltage, while output terminal 746 is at a high voltage. As seen from FIG. 7B, at least one of P-channel transistors 734–736 coupled to each of output terminals 741–745 and 747–748 are off (which disconnects Vcc to the corresponding output terminal), and at least one of N-channel transistors 731–733 coupled to each of output terminals 741–745 and 747–748 are on (which pulls the corresponding output terminal to ground). Thus, output terminals 741–745 and 747–748 are at a "low" level. However, with $\overline{A_2}=0$, $A_1=0$, and $\overline{A_0}=0$, N-channel transistors 731–733 coupled to output terminal 746 disconnects terminal 746 from ground. Further, with $\overline{A_2}=0$, $A_1=0$, and $\overline{A_0}=0$, P-channel transistors 734–736 are on, thereby connecting Vcc to output terminal 746 to place terminal 746 at a "high" voltage level. Thus, NOR decoder 710 generates signals for selecting four of the 32 input signals.

Figure 7C:
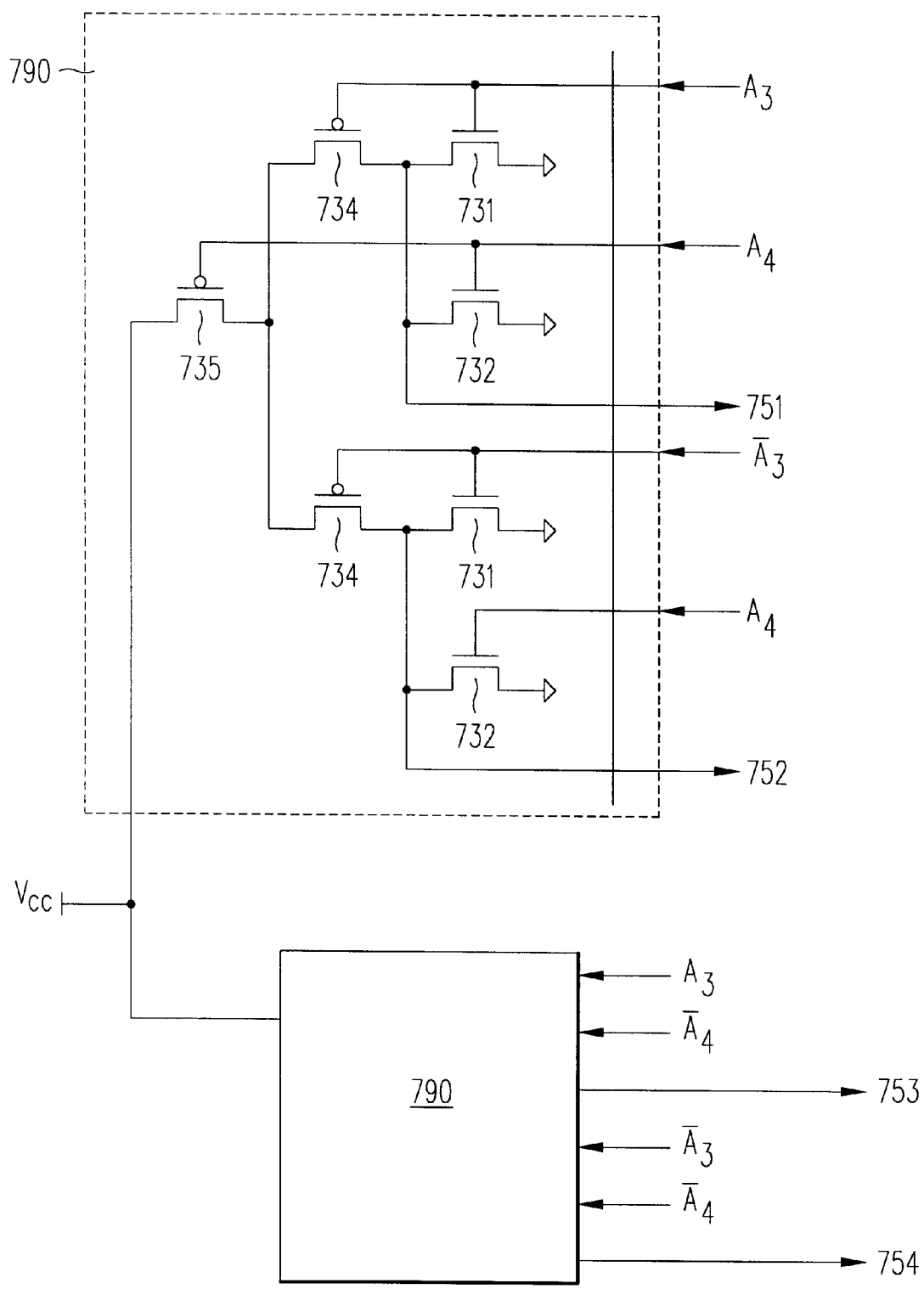
FIG. 7C is a diagram of one embodiment of a two-input NOR decoder for outputting four signals for use as a portion of the pre-decoding circuit of FIG. 7A.

FIG. 7C shows one implementation of two-input NOR decoder 720, which also includes a series of P-channel and N-channel transistors. Each of the four two-input NOR gates 740 has two N-channel transistors 731 and 732 and one P-channel transistor 734, and each pair 790 of NOR gates 740 shares one P-channel transistor 735 coupled to supply voltage Vcc. Each of four output terminals 751–754 are coupled to one of four input terminals of decoder circuit 510 for selecting one of four signals. Based on the input to NOR decoder 720, the signals $A_4 A_3$ dictate which one of the four output terminals 751–754 is at a "high" voltage. The other three output terminals are at a "low" voltage. Table 2 below lists the values of $A_4 A_3$ for selecting the listed ones of the 32 input signals and the corresponding one of the four output terminals that are at a high voltage.

TABLE 2

| $A_4 A_3$ | Input signal selected | Output terminal high |
| --- | --- | --- |
| 00 | $S_0, S_1, S_2, S_3, S_4, S_5, S_6, S_7$ | 751 |
| 01 | $S_8, S_9, S_{10}, S_{11}, S_{12}, S_{13}, S_{14}, S_{15}$ | 752 |
| 10 | $S_{16}, S_{17}, S_{18}, S_{19}, S_{20}, S_{21}, S_{22}, S_{23}$ | 753 |
| 11 | $S_{24}, S_{25}, S_{26}, S_{27}, S_{28}, S_{29}, S_{30}, S_{31}, S_{32}$ | 754 |

Continuing with the above example, to select signal $S_{21}$, $A_4 A_3 A_2 A_1 A_0 = 10101$. As seen from FIG. 7C, with $A_4 A_3 = 10$, output terminals 751 (with input signals $A_4=1$ and $A_3=0$), 752 (with input signals $A_4=1$ and $\overline{A_3}=1$), and 754 (with input signals $\overline{A_4}=0$ and $\overline{A_3}=1$) are at a low voltage, while output terminal 753 (with input signals $\overline{A_4}=0$ and $A_3=0$) is at a high voltage. This selects a signal from the third group of signals $S_{16}, S_{17}, S_{18}, S_{19}, S_{20}, S_{21}, S_{22}, S_{23}$. However, NOR decoder 710 generated signals to select a signal from the sixth group of signals $S_5, S_{13}, S_{21}, S_{29}$, as discussed above. Thus, signal $S_{21}$, which is the common signal selected from NOR decoders 710 and 720, is selected from the group of 32 input signals.

Figure 8A:
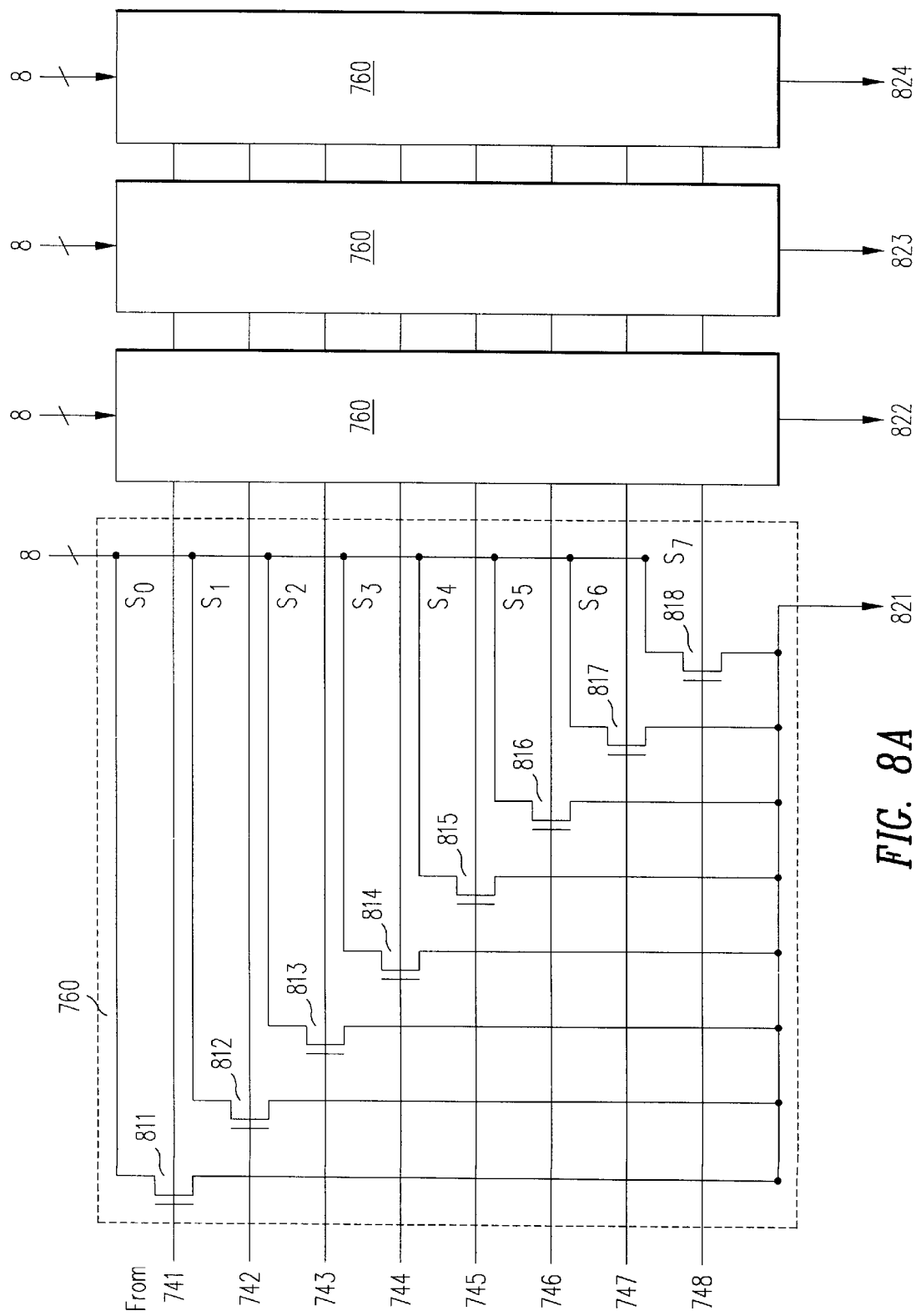
FIG. 8A is a diagram of one embodiment of four 8 to 1 decoders for use as a portion of the decoder circuit of FIG. 7A.

FIG. 8A shows one implementation of the four 8 to 1 decoders 760 of FIG. 7A forming part of decoder circuit 510 for selecting four of the 32 input signals based on the eight input signals from NOR decoder 710. Each 8 to 1 tree decoder 760 has eight N-channel transistors 811–818, with the drain of each of the eight N-channel transistors coupled to one of eight input signals $S_0$ to $S_7$, $S_8$ to $S_{15}$, $S_{16}$ to $S_{23}$, or $S_{24}$ to $S_{31}$. For example, the eight N-channel transistors 811–818 in the first one of decoders 760 are coupled to input signals $S_0$ to $S_7$, as shown. The control gate of one N-channel transistor in each of the four decoders 760 is coupled to one of the eight signals from output terminals 741–748 of NOR decoder 710, and the source of each of the eight N-channel transistors 811–818 in each decoder 760 is commonly coupled to an output terminal 821–824. Thus, depending on which of the eight signals from NOR decoder 710 is at a high voltage, four of the 32 input signals will be selected (by turning on the appropriate four N-channel transistors) and placed onto output terminals 821–824. For example, if the signal at output terminal 743 is at a high voltage, while the other seven terminals are at a low voltage, then input signals $S_2, S_{10}, S_{18}$, and $S_{26}$ are selected and placed on output terminals 821–824, respectively.

Figure 1:
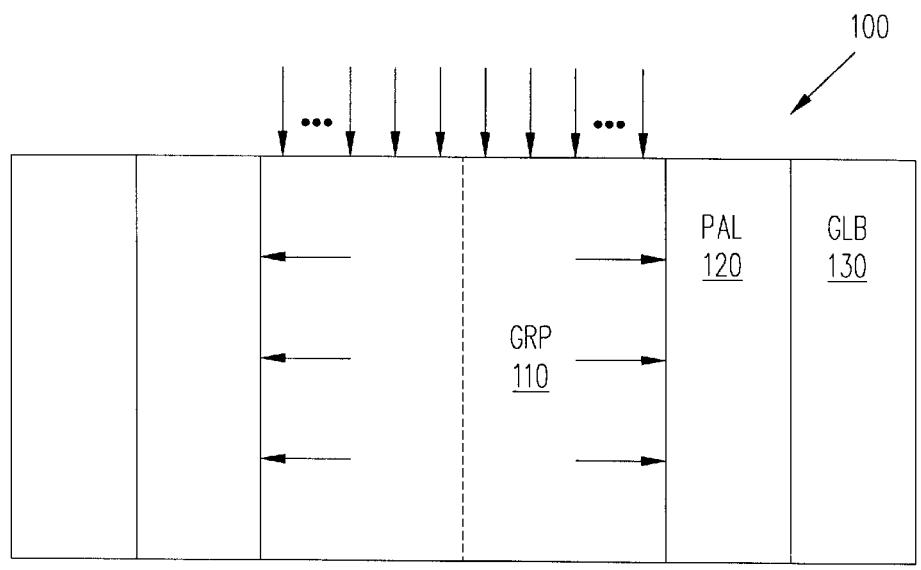
FIG. 1 is a block diagram of a general programmable logic device (PLD)
Figure 2:
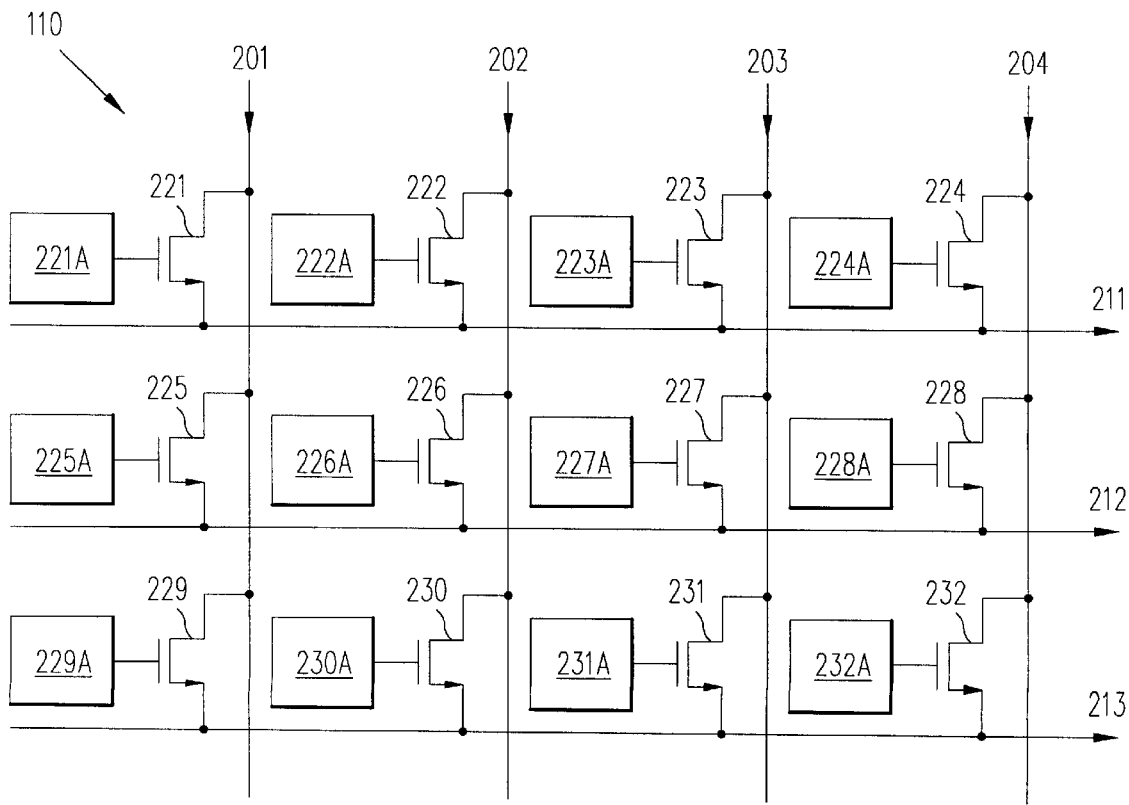
FIG. 2 is a diagram of an interconnection matrix as part of a global routing pool of the PLD of FIG. 1.
Figure 3:
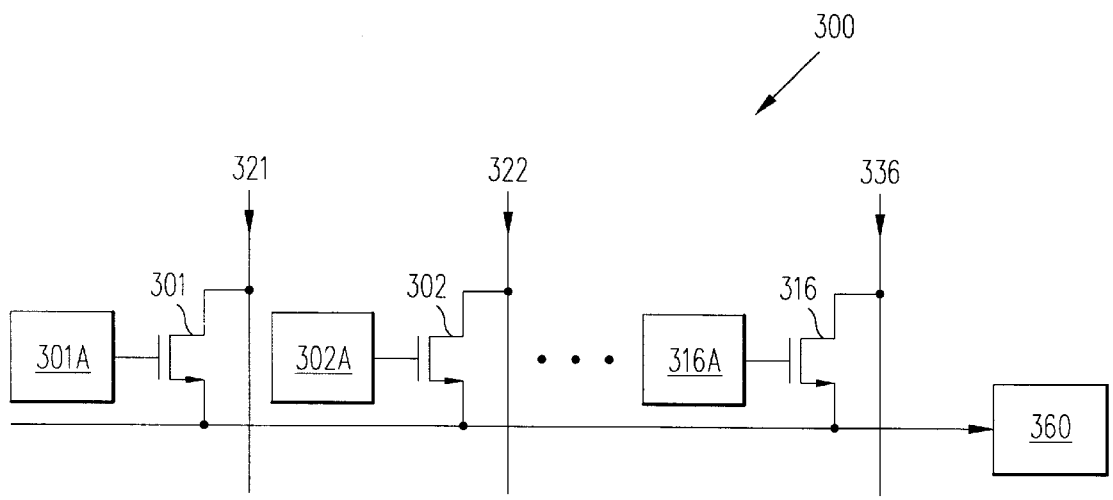
FIG. 3 is a diagram of a 1×16 interconnection matrix for selecting one of 16 signals.
Figure 4:
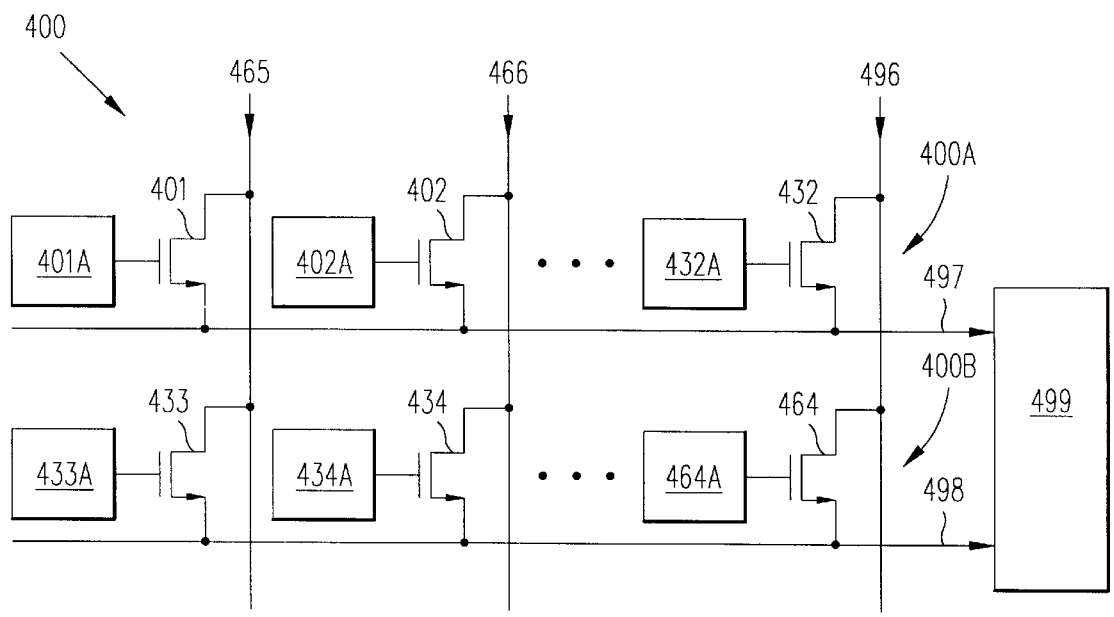
FIG. 4 is a diagram of an interconnection matrix for selecting two of 32 signals.
Figure 8B:
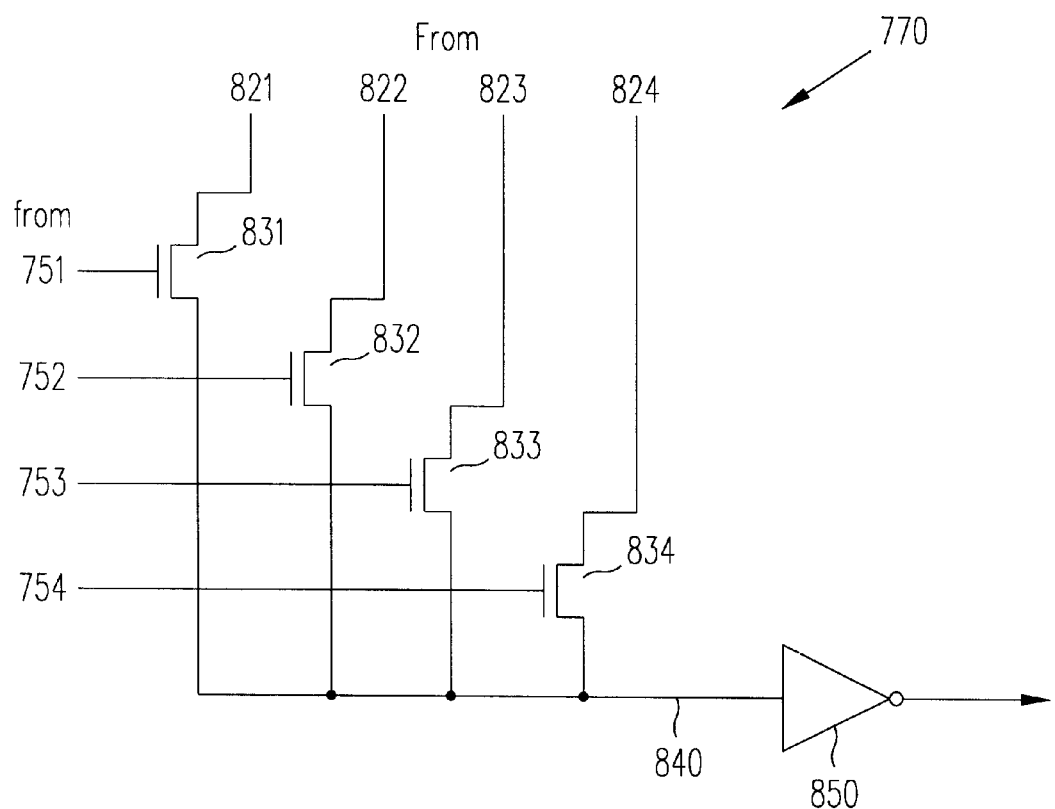
FIG. 8B is a diagram of one embodiment of a 4 to 1 decoder for use as a portion of the decoder circuit of FIG. 7A.

The four output terminals 821–824 are coupled to 4 to 1 decoder 770, an embodiment of which is shown in FIG. 8B. Decoder 770 includes four N-channel transistors 831–834, each having a drain coupled to one of respective output terminals 821–824 and a source commonly coupled to an output terminal 840. Output terminal 840 is coupled to a buffer 850, which drives or amplifies a selected signal out of the group of 32 input signals to a desired source, such as PAL 501. Thus, the four 8 to 1 decoders 760 and one 4 to 1 decoder 770 forming the 32 to 1 decoder 510 allows local decoding of a group of 32 input signals. This enables a selected signal from decoder 510 to be buffered and driven to the desired PAL input. The control gate of each of the four N-channel transistors 831–834 is coupled to the four output signals from terminals 751–754 of NOR decoder 720. By applying a high voltage signal to a desired one of N-channel transistors 831–834, the desired transistor is turned on, thereby placing the selected one of the four signals from decoders 760 onto output terminal 840. As a result, a desired one of 32 input signals is selected utilizing only five programmable cells 610, as opposed to 32 as described above with respect to FIG. 4. Thus, the number of programmable cells in a PLD for selecting 16 of 256 input signals can be reduced from 512 (16*32) to 80 (16*5) or by a factor of over six.

Figure 9:
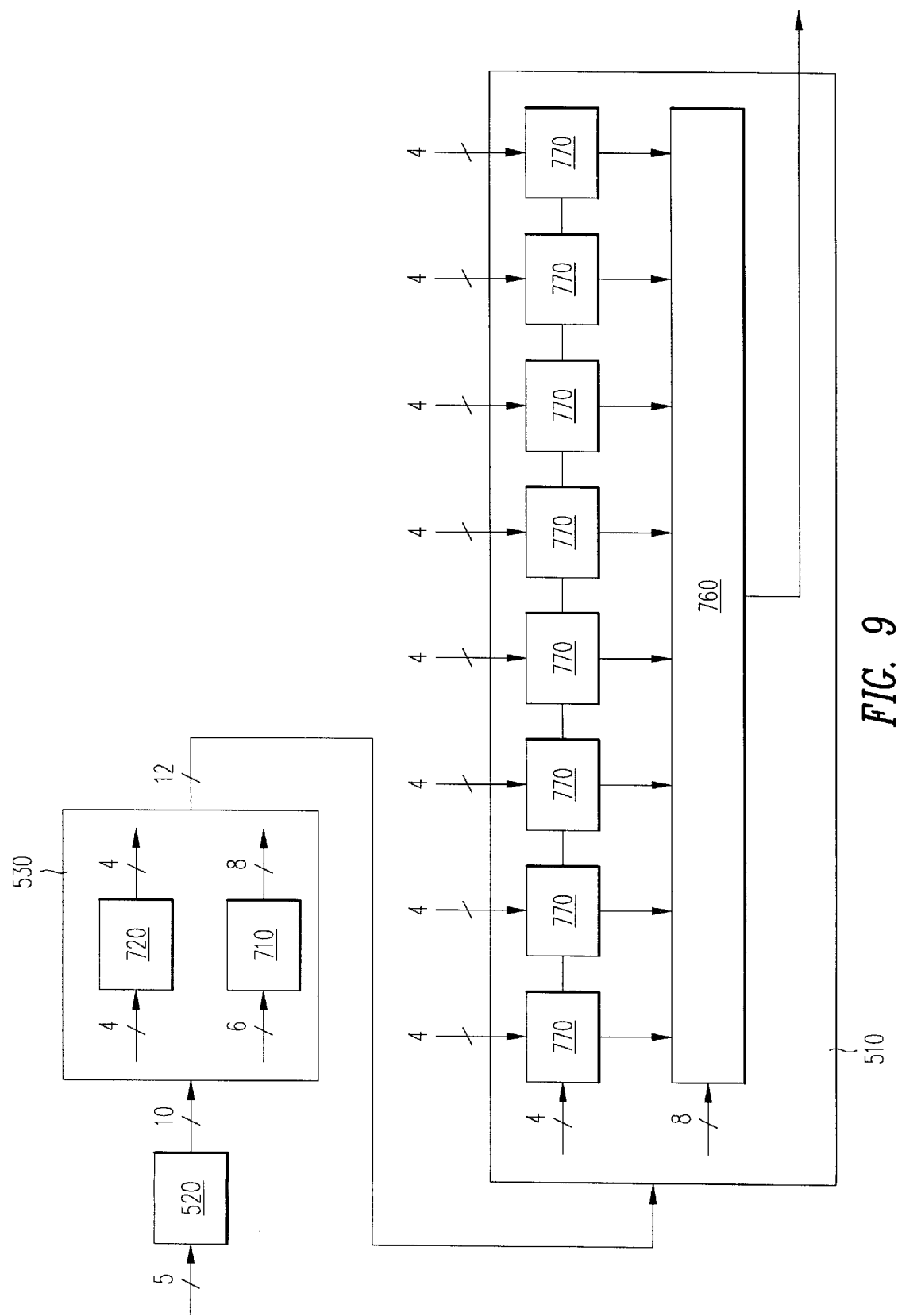
FIG. 9 is a block diagram of a portion of a global routing pool for selecting one of 32 signals according to another embodiment of the present invention.

Another embodiment of PLD 500 of FIG. 5 is shown in FIG. 9. Pre-decoding circuit 530 accepts the same ten signals from term generation circuit 520 as before. Pre-coding circuit 530 includes one two-input NOR decoder 720 and one three-input NOR decoder 710, where NOR decoder 720 accepts signals $A_1 A_0$ (and their complements) from term generation circuit 520 and NOR decoder 710 accepts signals $A_4 A_3 A_2$ (and their complements) from term generation circuit 520. NOR decoders 710 and 720 are the same as those described above with reference to FIGS. 7B and 7C above. The four output signals from NOR decoder 720 and the eight output signals from NOR decoder 710 are coupled to decoder circuit 510. Decoder circuit 510 includes eight 4 to 1 decoders 770 and one 8 to 1 decoder 760. Decoders 770 and 760 are described above with reference to FIGS. 8A and 8B. With this partitioning, the input group of 32 signals for selection is divided into eight groups of four signals each. Each of the eight groups of four input signals is coupled to one of the eight 4 to 1 decoders 770. With the four output signals from NOR decoder 720 coupled to each of the eight 4 to 1 decoders 770, one of the four input signals is selected and output from each of the eight 4 to 1 decoders. These eight selected signals are then coupled to the 8 to 1 decoder 760. Eight output signals from NOR decoder 710 coupled to 8 to 1 decoder 760 select the desired one of the eight signals from the eight 4 to 1 decoders 770. The selected signal is buffered and driven to the desired source, e.g., PAL 501. Other combinations of decoding 32 input signals to one desired signal are also suitable, such as utilizing one 32 to 1 decoder, as is known to those skilled in the art. Further, the invention can be used with other levels of decoding, e.g., one or three.

Thus, the present invention allows the number of programmable cells in a PLD to be reduced from $2^N$ to N, thereby greatly decreasing the size of the PLD. Accordingly, the PLD's die size is decreased, resulting in more dies (or chips) per wafer and a lower cost per chip. Further, the present invention provides for faster signal propagation through the routing of the PLD or programming of the PLD. Localized decoding of the signals allows single buffers to be inserted at the output of the decoder so that the selected signals can be buffered before driven to desired destinations.

Although the invention has been described with reference to particular embodiments, the description is only an example of the invention's application and should not be taken as a limitation. For example, the description illustrated routing or selecting one of 32 input signals for use in a routing pool for routing 16 of 256 signals. However, other sizes of routing pools can also be implemented with decoding of present invention. Consequently, various adaptations and combinations of features of the embodiments disclosed are within the scope of the invention as defined by the following claims.

I claim:

1. An interconnect device for selecting one of M input signals, M being $2^N$ or less, comprising:

N electrically programmable cells; and a decoding circuit coupled to the N programmable cells, wherein the decoding circuit has M input terminals coupled to the M input signals and an output terminal for outputting one of the M input signals based on the outputs of the N programmable cells.

2. The device of claim 1, wherein the decoding circuit comprises at least one tree decoder.

3. The device of claim 1, wherein each of the N electrically programmable cells outputs a selection signal and a complement of the selection signal.

4. The device of claim 3, wherein the N selection signals represent which one of the M input signals is to be selected.

5. The device of claim 1, further comprising a pre-coding circuit coupled between the N programmable cells and the decoder circuit.

6. The device of claim 5, wherein each of the N programmable cells outputs a selection signal and a complement of the selection signal to the pre-coding circuit, and wherein, based on the N selection signals and complements, the pre-coding circuit generates k groups of $X_i$ coded signals per group according to the relation $$2^N = \prod_{i=1}^{k} X_i.$$

7. The device of claim 6, wherein k is greater than one.

8. The device of claim 7, wherein the pre-coding circuit comprises k groups of NOR gates, each group of NOR gates comprising $X_i$ NOR gates, each of the $X_i$ NOR gates having $\log_2 X_i$ inputs.

9. The device of claim 7, wherein the decoder circuit comprises k sequentially coupled decoder sub-groups.

10. The device of claim 9, wherein the first decoder sub-group comprises $2^N/X_i$ decoders, each decoder coupled to $X_i$ coded signals and a group of $X_i$ input signals from the M input signals.

11. The device of claim 7, wherein the decoder sub-groups comprise $X_i \times 1$ tree decoders.

12. The device of claim 1, wherein the output terminal is coupled to a programmable array logic.

13. The device of claim 12, wherein the programmable array logic is coupled to a generic logic block.

14. An interconnect device for selecting multiple signals from M input signals, M being $2^N$ or less, comprising:

N first electrically programmable cells;

a first decoding circuit coupled to the N first programmable cells, wherein the first decoding circuit has M input terminals coupled to the M input signals and an output terminal for outputting one of the M input signals based on the outputs of the N first programmable cells;

N second electrically programmable cells; and a second decoding circuit coupled to the N second programmable cells, wherein the second decoding circuit has M input terminals coupled to the M input signals and an output terminal for outputting one of the M input signals based on the outputs of the N second programmable cells.

15. A method of selecting one or more signals from M input signals, M being $2^N$ or less, comprising:

generating N selection signals from N programmable cells; and selecting one signal from the M input signals based on the N selection signals.

16. The method of claim 15, further comprising:

generating N second selection signals from N second programmable cells; and selecting one signal from the M input signals based on the N second selection signals.

17. The method of claim 15, further comprising generating N complementary selection signals from the N programmable cells.

18. The method of claim 17, further comprising pre-coding the N selection signals and the N complementary selection signals.

19. The method of claim 18, wherein the pre-coding generates k groups of $X_i$ coded signals per group according to the relation $$2^N = \prod_{i=1}^{k} X_i.$$

20. The method of claim 19, wherein k is greater than one.

21. The method of claim 20, wherein the selecting comprises selecting $2^N/X_i$ signals from the M input signals.

22. The method of claim 20, wherein the selecting further comprises sequentially selecting remaining signals until the one signal is selected.

23. The method of claim 15, further comprising coupling the selected signal to a programmable array logic.

24. The method of claim 23, further comprising coupling the programmable array logic to a generic logic block.

* * * * *